United States Patent
Sakai et al.

(10) Patent No.: US 7,994,055 B2
(45) Date of Patent: Aug. 9, 2011

(54) METHOD OF MANUFACTURING SEMICONDUCTOR APPARATUS, AND SEMICONDUCTOR APPARATUS

(75) Inventors: Hisaya Sakai, Kawasaki (JP); Noriyoshi Shimizu, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 411 days.

(21) Appl. No.: 12/022,742

(22) Filed: Jan. 30, 2008

(65) Prior Publication Data

US 2008/0179747 A1  Jul. 31, 2008

(30) Foreign Application Priority Data

Jan. 31, 2007 (JP) ................. 2007-020570

(51) Int. Cl.
*H01L 21/44* (2006.01)
(52) U.S. Cl. ...................................... 438/687
(58) Field of Classification Search .............. None
See application file for complete search history.

(56) References Cited

U.S. PATENT DOCUMENTS

| | | | |
|---|---|---|---|
| 7,507,666 B2 * | 3/2009 | Nakao et al. | 438/687 |
| 2004/0188839 A1 * | 9/2004 | Ohtsuka et al. | 257/750 |
| 2005/0218519 A1 | 10/2005 | Koike et al. | |
| 2006/0125100 A1 * | 6/2006 | Arakawa | 257/758 |
| 2007/0020931 A1 | 1/2007 | Koura et al. | |
| 2008/0142974 A1 * | 6/2008 | Arakawa | 257/754 |

FOREIGN PATENT DOCUMENTS

JP   2005-277390 A   10/2005

OTHER PUBLICATIONS

"Proceedings of the International Interconnect Technology Conference," IEEE Electron Devices Society; Jun. 6-8, 2005; San Francisco, California.
T. Usui et al, "Low Resistive and Highly Reliable Cu Dual-Damascene Interconnect Technology Using Self-Formed MnSixOy Barrier Layer," Semiconductor Technology Academic Research Center, Jun. 2005.
Chinese Office Action dated Aug. 21, 2009, issued in corresponding Chinese Patent Application No. 200810009253

* cited by examiner

*Primary Examiner* — Charles D Garber
*Assistant Examiner* — Andre' C Stevenson
(74) *Attorney, Agent, or Firm* — Westerman, Hattori, Daniels & Adrian, LLP

(57) ABSTRACT

A method of manufacturing a semiconductor apparatus which includes the steps of forming a via hole and a wire trench reaching an underlying wire in an interlayer insulation film formed on the underlying wire, forming an diffusion barrier film on said underlying wire exposed through said via hole, on an inner wall of said via hole and on an inner wall of said wire trench, forming a seed layer on said underlying wire and on said diffusion barrier film formed on the inner wall of said via hole and the inner wall of said wire trench while concurrently said diffusion barrier film deposited on the bottom of said via hole is being etched, and forming metal wire in said via hole and in said wire trench.

13 Claims, 13 Drawing Sheets

METHOD OF MANUFACTURING SEMICONDUCTOR APPARATUS, AND SEMICONDUCTOR APPARATUS

CROSS-REFERENCE TO RELATED APPLICATIONS

This application is based upon and claims the benefit of priority from the prior Japanese Patent Application No. 2007-20570, filed on Jan. 31, 2007, the entire content of which is incorporated herein by reference.

TECHNICAL FIELD

The present invention relates to method of manufacturing a semiconductor apparatus using the damascene method and a semiconductor apparatus made according to this manufacturing method.

BACKGROUND OF THE INVENTION

The damascene method is sometimes used in situations when copper (Cu) wires are formed in wire trenches or via holes formed in interlayer insulation film. In order to prevent metallic diffusion, in the damascene method, a diffusion barrier film (barrier metal) is formed in the inner wall of the wire trenches or in the inner wall of the via holes before the metal wires are formed.

Refractory metals such as tantalum (Ta) or titanium (Ti), or nitride compounds of these metals are used as materials of the diffusion barrier film. However, these metallic films have high resistance, thereby causing increased resistance in metal wires and increased RC delay. Thus, as the shrinkage of metal wires has progressed in recent years, there is a trend towards thinner films being used for the diffusion barrier film.

On the other hand, with the objective of avoiding RC delay, there are cases where porous low-dielectric constant material is used as the material in the interlayer insulation film, for example. Porous low-dielectric constant material is easily damaged by plasma during the manufacturing process. The damaged film is more likely to absorb moisture on its surface or in its interior. Thus, the diffusion barrier film which is formed on such a low-dielectric constant material is easily oxidized or altered by the moisture released from the interlayer insulation film, thereby suffering degraded barrier capabilities.

In Japanese Unexamined Patent Application Publication No. 2005-277390, a technology using copper-manganese (CuMn) seed layers as material in diffusion barrier film is disclosed. In this method, a copper-manganese film is directly formed on the interlayer insulation film as the seed film for the plating of copper wires. According to this method, the manganese in the copper-manganese film reacts with the silicon and oxygen included in the interlayer insulation film, forming a 2 to 3 nm self-aligned $MnO_XSi_Y$ layer at the boundary between the interlayer insulation film and the copper wires. The $MnO_XSi_Y$ layer formed therein functions as an diffusion barrier film, thereby securing the barrier capabilities of copper wires in relation to the interlayer insulation film without using tantalum (Ta) or titanium (Ti) used in conventional diffusion barrier films.

However, in a manufacturing process using a copper-manganese film, a problem occurs in which favorable adhesion between the $MnO_XSi_Y$ layer and the interlayer insulation film cannot be achieved. Consequently, if a heat treatment is performed after the copper wires are formed for example, there are cases where the copper wires formed in the wire trenches or via holes move upward (siphon phenomenon). Additionally, there are cases where copper wires peel off during CMP (Chemical Mechanical Polish) process. As a result, a problem occurred in which separation occurred between the copper wires and the underlying wires formed under the copper wires and the yield of the semiconductor apparatus worsened.

Thus, the productivity of a semiconductor apparatus is not improved when an diffusion barrier film or copper-manganese seed layer is formed on an interlayer insulation film according to a conventional manufacturing process before copper wires are formed in the interlayer insulation film.

SUMMARY

According to an aspect of an embodiment, a method of manufacturing a semiconductor apparatus includes the steps of: forming a via hole and a wire trench reaching an underlying wire in an interlayer insulation film formed on the underlying wire; forming an diffusion barrier film on said underlying wire exposed through said via hole, on an inner wall of said via hole and on an inner wall of said wire trench; forming a seed layer on said underlying wire and on said diffusion barrier film formed on the inner wall of said via hole and the inner wall of said wire trench while concurrently said diffusion barrier film deposited on the bottom of said via hole is being etched; and forming metal wire in said via hole and in said wire trench.

According to another aspect of an embodiment, a method of manufacturing a semiconductor apparatus includes the steps of: forming a via hole and a wire trench reaching an underlying wire in an interlayer insulation film formed on the underlying wire; forming a first seed layer on said underlying wire exposed through said via hole, on an inner wall of said via hole, and on an inner wall of said wire trench; forming a second seed layer on said first seed layer formed on said underlying wire exposed through said via hole, on said inner wall of said via hole, and on said inner wall of said wire trench while concurrently said first seed layer deposited on the bottom of said via hole is being etched; and forming a metal wire in said via hole and in said wire trench.

According to further another aspect of an embodiment, a semiconductor apparatus includes: an underlying wire; an interlayer insulation film formed on said underlying wire; a via hole and a wire trench formed in said inter layer insulation film; an diffusion barrier layer formed on an inner wall of said via hole and on an inner wall of said wire trench; a metal wire formed in said via hole and said wire trench, and coupled to said underlying wire; and a barrier layer formed on a surface boundary between said diffusion barrier film and said metal wire.

DETAILED DESCRIPTION OF THE EMBODIMENT

First Embodiment

Figure 1:
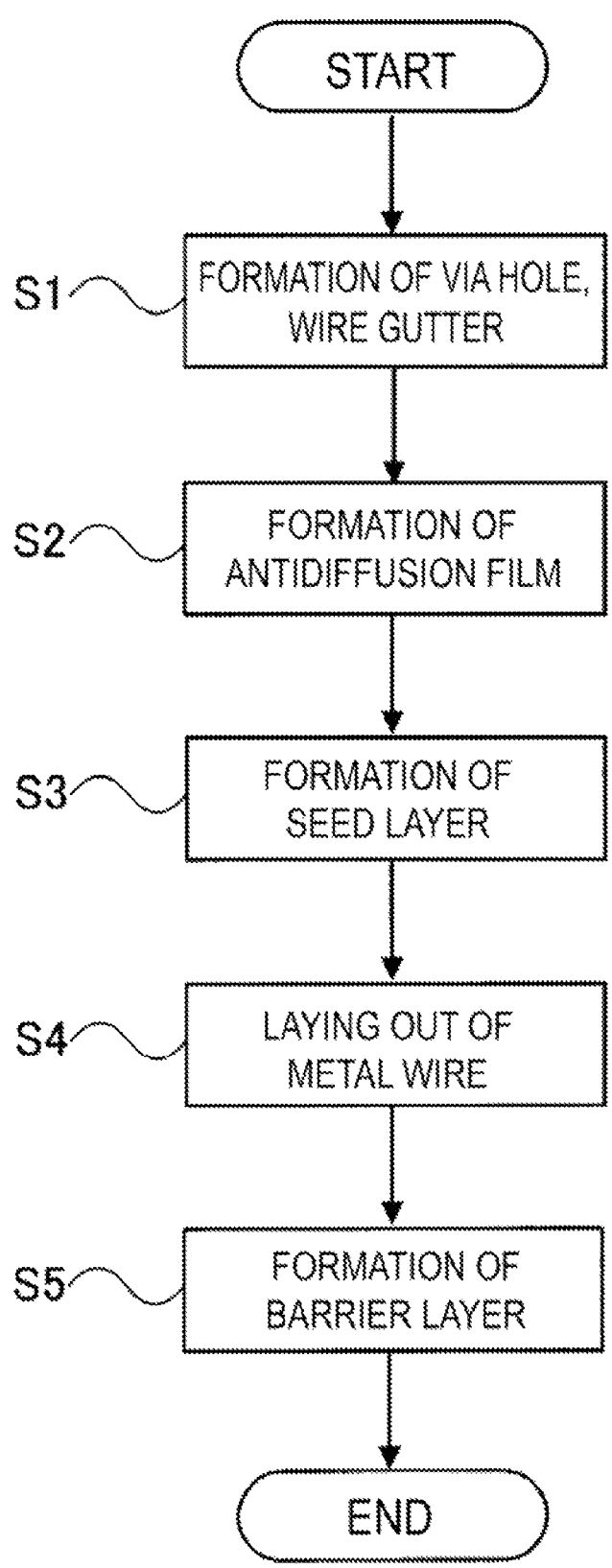
FIG. 1 is a flow diagram of a process for manufacturing a semiconductor apparatus according to an embodiment.

FIG. 1 is a flow diagram of a process for manufacturing a semiconductor apparatus according to an embodiment.

As shown in FIG. 1, in a method of manufacturing a semiconductor apparatus according to the first embodiment, first, via holes and wire trenches are formed in the interlayer insulation film which is formed on the underlying wires (Step S1).

The diffusion barrier film is formed on the inner walls of via holes, the inner walls of wire trenches, and on the underlying wires exposed from the via holes (Step S2).

While physically etching the diffusion barrier film deposited onto the bottom of the via holes, a seed layer is formed on the diffusion barrier film (Step S3).

After the seed layer is formed, metal wires are formed in the via holes and the wire trenches by electroplating method. (Step S4).

An annealing process is performed to form a barrier layer, by which seed layer components are used as raw materials, onto the surface boundary between the diffusion barrier film and the metal wire, or onto the surface boundary between the metal wire and the interlayer insulation film existing on the side of the underlying wires (Step S5).

In the first embodiment, a manufacturing apparatus having high barrier capabilities and having an diffusion barrier film and barrier layer with favorable adhesion can be manufactured. Therefore, productivity of a semiconductor apparatus is improved.

The first embodiment is explained below in more detail.

Figure 2:
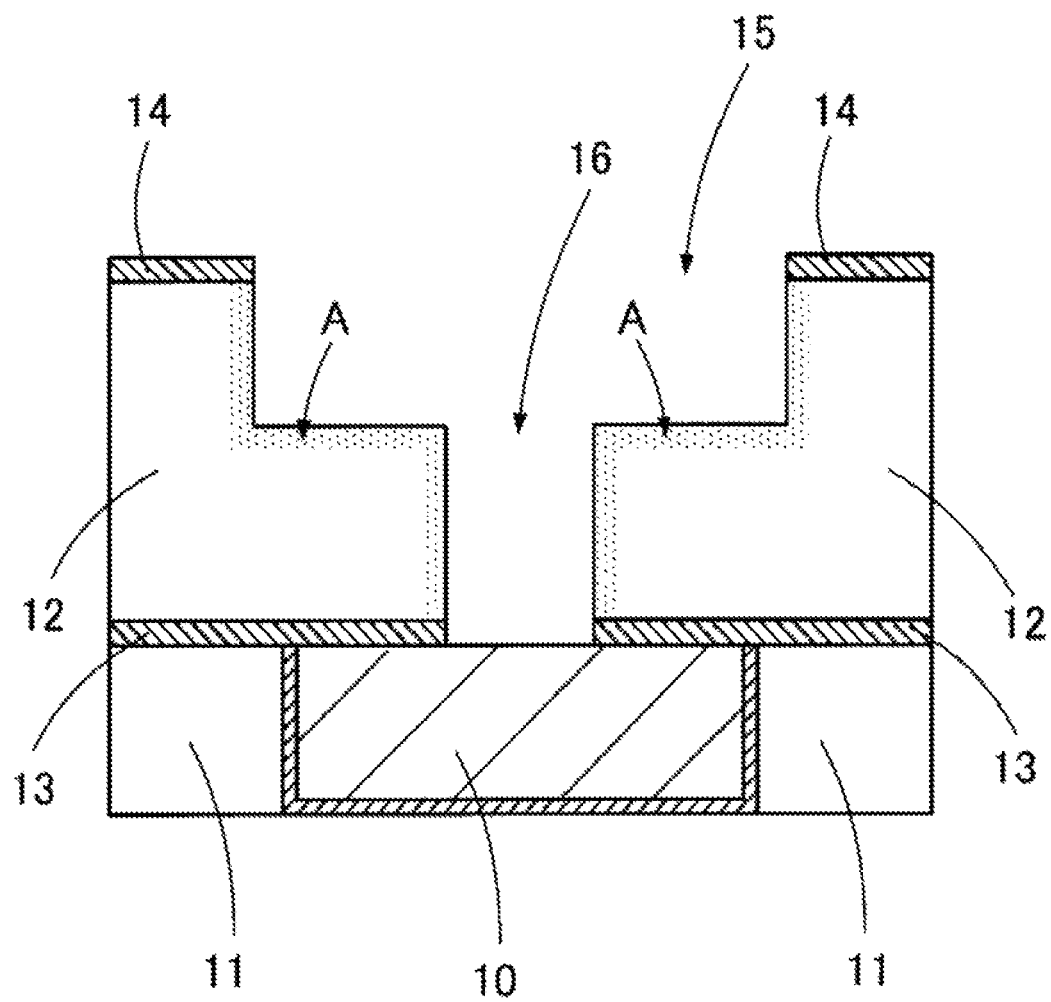
FIG. 2 is a schematic view of a process for manufacturing a semiconductor apparatus according to an embodiment.

FIG. 2 through FIG. 8 are schematic views of a process for manufacturing a semiconductor apparatus according to an embodiment. As shown in FIG. 2, a substrate used in the first embodiment includes an underlying wire 10, interlayer insulation film 11 and 12, a cap layer 13 formed on the underlying wire 10 and the interlayer insulation film 11, and a hard mask layer 14 formed on the interlayer insulation film 12. However, the structure of the substrate is not limited to the first embodiment.

The material of the cap layer 13 and the hard mask layer 14 consists of material such as silicon carbide (SiC). The film thickness of the cap layer 13 and the hard mask layer 14 is about 10 nm, for example. The film thickness of the interlayer insulation film 12 is several 100 nm, for example. The material of the interlayer insulation film 12 is preferably a low-dielectric constant material (low-k material). Inorganic materials, organic materials, or admixtures thereof are used as low-dielectric constant materials. Porous materials can also be used as the material in the interlayer insulation film 12. In the first embodiment, a silicon oxide containing carbon such as SiOC is used as the material in the interlayer insulation film 12. The interlayer insulation film 12 can be formed by the SOG (Spin On Glass) method or the CVD (Chemical Vapor Deposition) method.

Once a substrate like the above has been prepared, a mixed gas including a fluorocarbon ($CF_x$) gas, an ammonia ($NH_3$) gas, nitrogen ($N_2$), and hydrogen ($H_2$) is used as an added gas to etch the hard mask layer 14, the interlayer insulation film 12, and the cap layer 13 by way of plasma etching. Thus, a trench 15 and a via hole 16 are formed in the interlayer insulation film 12. The trench 15 is used for forming an upper layer. The via hole 16 is used for forming a contact electrode coupling an upper layer wires and the upper layer wire and the underlying wire 10. Note the surface of the underlying wire 10 is exposed to plasma etching.

The shaded area on the inner wall of the interlayer insulation film 12 (the part indicated by the arrow A in FIG. 2) represents moisture contained in areas damaged by plasma in another manufacturing process. One example of another manufacturing process is a low-dielectric material etching process.

Figure 3:
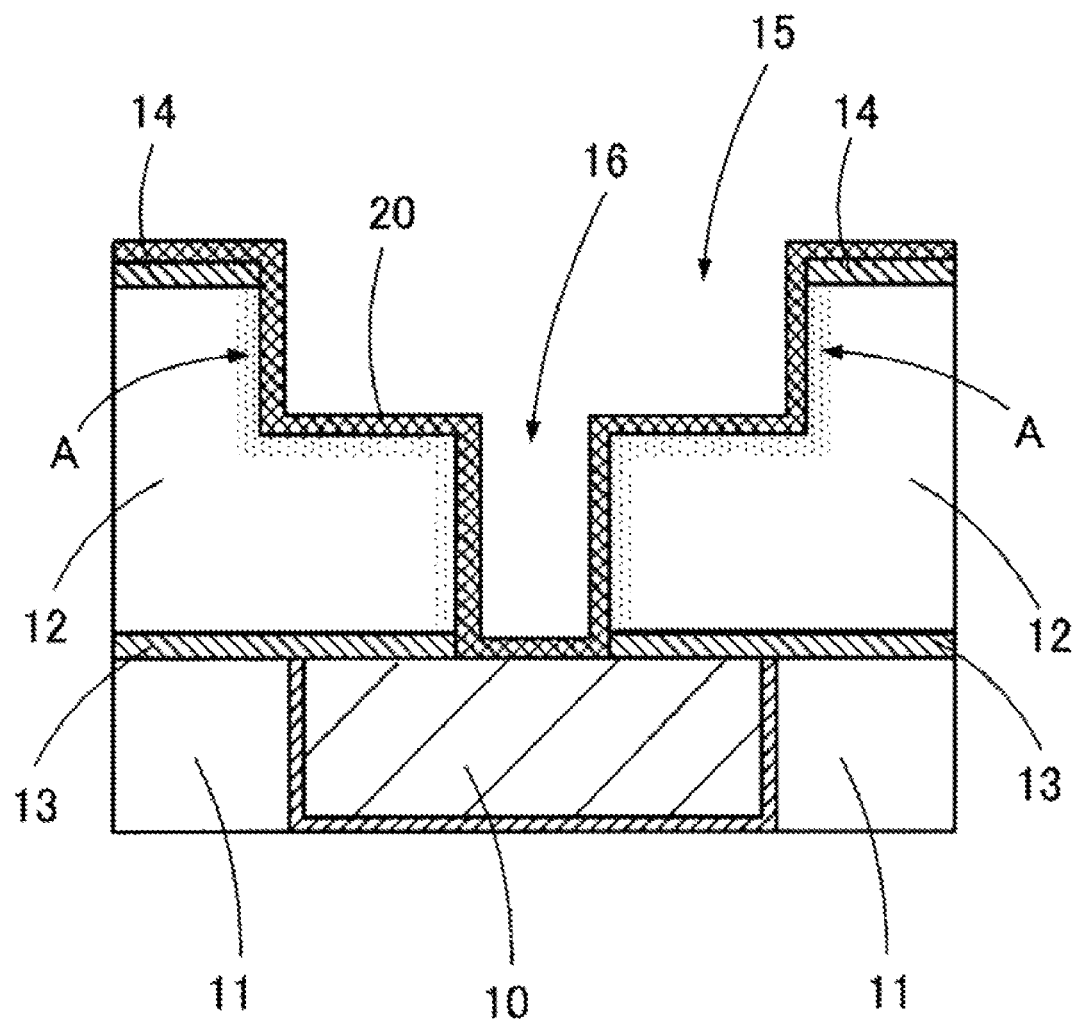
FIG. 3 is a schematic view of a process for manufacturing a semiconductor apparatus according to an embodiment.

As shown in FIG. 3, an diffusion barrier film 20 is formed using the sputtering method (i.e., Long Throw Sputter; LTS) on the surface of the inner wall of the trench 15, the inner wall of the via hole 16, and a surface of the underlying wire 10 exposed from the via hole 16. Either argon (Ar) or nitrogen is used as a discharge gas. The target injection power is from 160 to 640 $mW/m^2$, for example. The thickness of the diffusion barrier film 20 is from 5 to 10 nm, for example. The material of the diffusion barrier film 20 is a material containing at least one of the following metals: tantalum (Ta), tungsten (W), titanium (Ti), zirconium (Zr), ruthenium (Ru), and nitrides of these metals. Note, when forming the diffusion barrier film 20, applying a bias of from 0 to 3 $mW/m^2$ to the substrate is also acceptable. Also, instead of the sputtering method, the CVD (Chemical Vapor Deposition) method or the ALD (Atomic Layer Deposition) method can alternatively be used as the method of forming the diffusion barrier film 20.

However, as mentioned above, either the diffusion barrier film 20 is easily oxidized or altered by the moisture contained in the interlayer insulation film 12, or a partial degradation resulting in degraded barrier capability will occur. Therefore, in the first embodiment, in order to compensate for the barrier deficiencies of the diffusion barrier film 20, an oxide layer including manganese is formed onto the diffusion barrier film 20 in a self-aligned manner as explained hereinafter.

Figure 4:
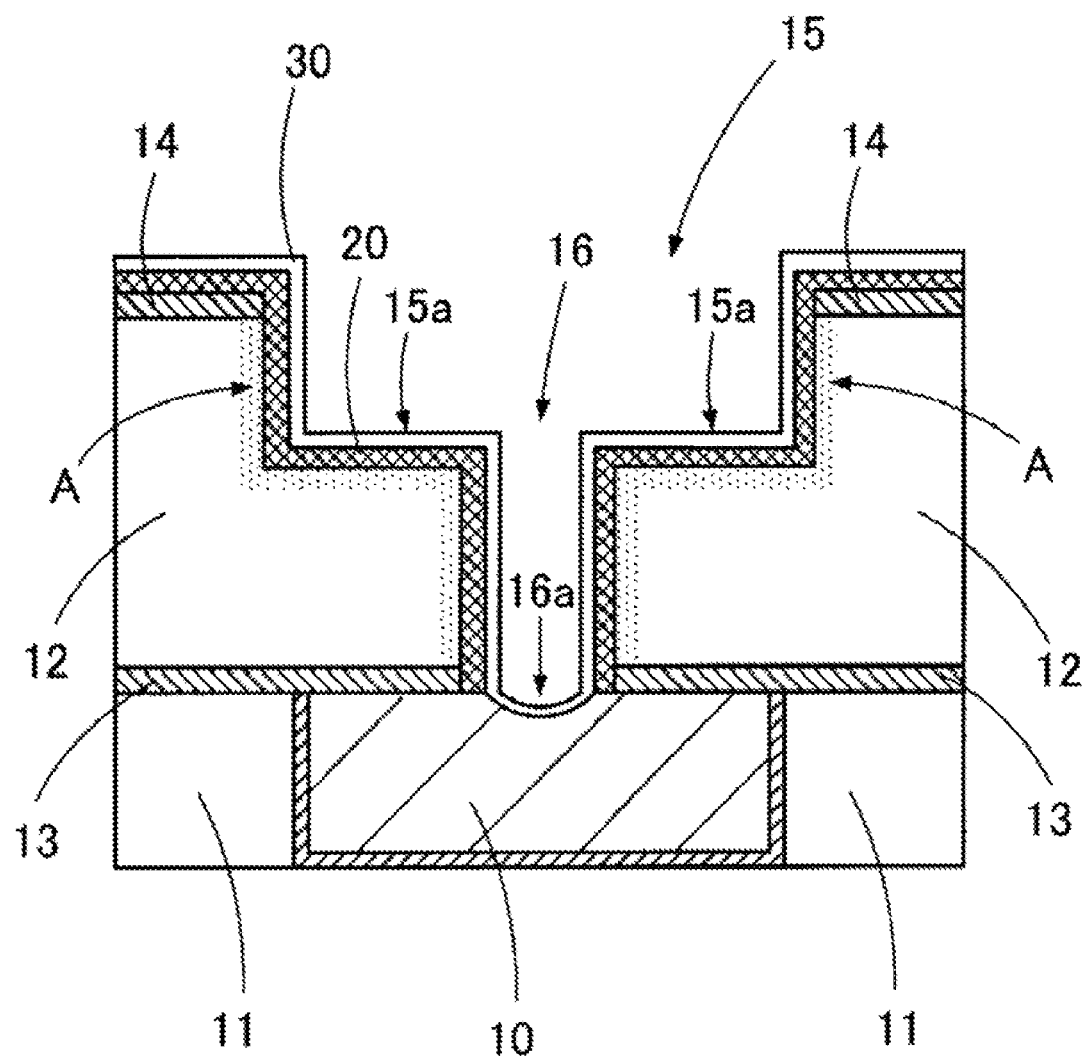
FIG. 4 is a schematic view of a process for manufacturing a semiconductor apparatus according to an embodiment.

First, as specifically shown in FIG. 4, a copper-manganese seed layer 30 is formed on the diffusion barrier film 20 by the sputtering method. A copper target with a manganese ratio of 0.5 to 10 atom % is used as the target. In the current process, sputtering is divided into a first stage and a second stage, forming the copper-manganese seed layer 30.

In the first stage, argon is used as a discharge gas, a target injection power of 160 to 960 $mW/m^2$ is applied at an atmospheric pressure of from $10^{-5}$ to 10 Pa to form the copper-manganese seed layer 30 as a first seed layer on the inner wall of the trench 15, the inner wall of the via hole 16, and the surface of the underlying wire 10 exposed from the via hole 16. The film thickness of the copper-manganese seed layer 30 formed in the first stage is 10 to 30 nm, for example. Note, when forming the copper-manganese seed layer 30 in the first stage, applying a bias of from 6 to 16 $mW/m^2$ is also acceptable.

Then, in the second stage, a copper-manganese seed layer 30 as the second seed layer is formed on the first seed layer. Note, with a bias of from 6 to 10 $mW/m^2$ continuing to be applied to the substrate, an atmospheric pressure of from $10^{-5}$ to 10 Pa and a target injection power of from 16 to 160 mW/m² are applied. Thus, the incidence frequency of the incident copper-manganese in the trench 15 and in the via hole 16 is reduced relative to the first stage. In other words, in the second stage, the etching effect (resputtering effect) of argon ions or metallic ions emitted from the target is increased compared with the first stage, and then sputtering is executed. Especially in the second stage, sputtering is executed while regulating the ratio (Vd/Ve) of the deposition rate (Vd) of the manganese seed layer to the etching rate (Ve) on the upper face of the interlayer insulation film 12 so the Vd/Ve ratio is greater than 0.9 but less than 2.0.

Note, the content percentage of manganese in the copper target is not limited to the aforementioned values. For example, a copper target including more than 10 atom % of manganese is also acceptable. Alternatively, a binary sputter method can be used wherein a manganese target and a copper target are used. In this case, the ratio of manganese to copper contained in the seed film can be made to vary by establishing a difference in the target injection power. Note, the film thickness of the copper-manganese seed layer 30 formed in the second stage is from 0 to 10 nm, for example.

According to the first embodiment, in the second stage, the diffusion barrier film 20 formed in advance on the bottom 16a of the via hole 16 and part of the surface of the underlying wire 10 are etched by argon ions or metallic ions emitted from the target. Simultaneously, the copper-manganese seed layer 30 is formed in the bottom 16a of the via hole 16. In other words, while etching the diffusion barrier film 20 deposited onto the bottom 16a of the via hole 16 and a part of the underlying wire 10, the copper-manganese seed layer 30 is deposited on the diffusion barrier film 20 formed on the underlying wire 10 and the inner wall of the interlayer insulation film 12.

Therefore, the diffusion barrier film 20 is removed from the bottom 16a of the via hole 16, so any increase in wire resistance or RC delay is suppressed. Additionally, the diffusion barrier film and copper-manganese formed on the bottom 16a of the via hole 16 is deposited by the resputtering effect on the inner wall of the via hole 16 and the inner wall of the trench 15, thereby improving the barrier capabilities of the inner wall of the via hole 16 and the inner wall of the trench 15.

Incidentally, in order to remove the diffusion barrier film 20 from the bottom 16a of the via hole 16, the etching effect during the diffusion barrier film 20 formation might be made more pronounced. However, if titanium, zirconium, or a nitride thereof is selected as the material for the diffusion barrier film 20, the shape of the upper part of the via hole 16 can be made round by making the etching effect more pronounced. As a result, in an diffusion barrier film 20 using these materials, the coverage inside the via hole 16 might be reduced and the barrier capabilities of the diffusion barrier film might thereby be impaired.

However, if the aforementioned second stage process is performed after the diffusion barrier film 20 is formed under normal sputter conditions, a round shape of the upper part of the via hole 16 can be avoided. First, if a titanium, zirconium, or a nitride of either thereof is used as the material for the diffusion barrier film 20, the diffusion barrier film 20 is formed under normal sputter conditions with a weak etching effect. Next, the diffusion barrier film 20 deposited on the bottom 16a of the via hole is removed by the argon ions or the metallic ions emitted from the target in the aforementioned second stage, then the diffusion barrier film 20 deposited on the bottom 16a is deposited on the inner wall of the via hole 16 by way of resputtering. Thus, decreased coverage of the diffusion barrier film 20 in the via hole 16 can be prevented.

Note, even if the diffusion barrier film 20 in the inner wall of the via hole is extremely thin, or if there are local defects in the diffusion barrier film 20, the barrier capabilities are ensured since the reaction layer barrier including manganese oxide in these areas is formed in a self-aligned manner.

Figure 5:
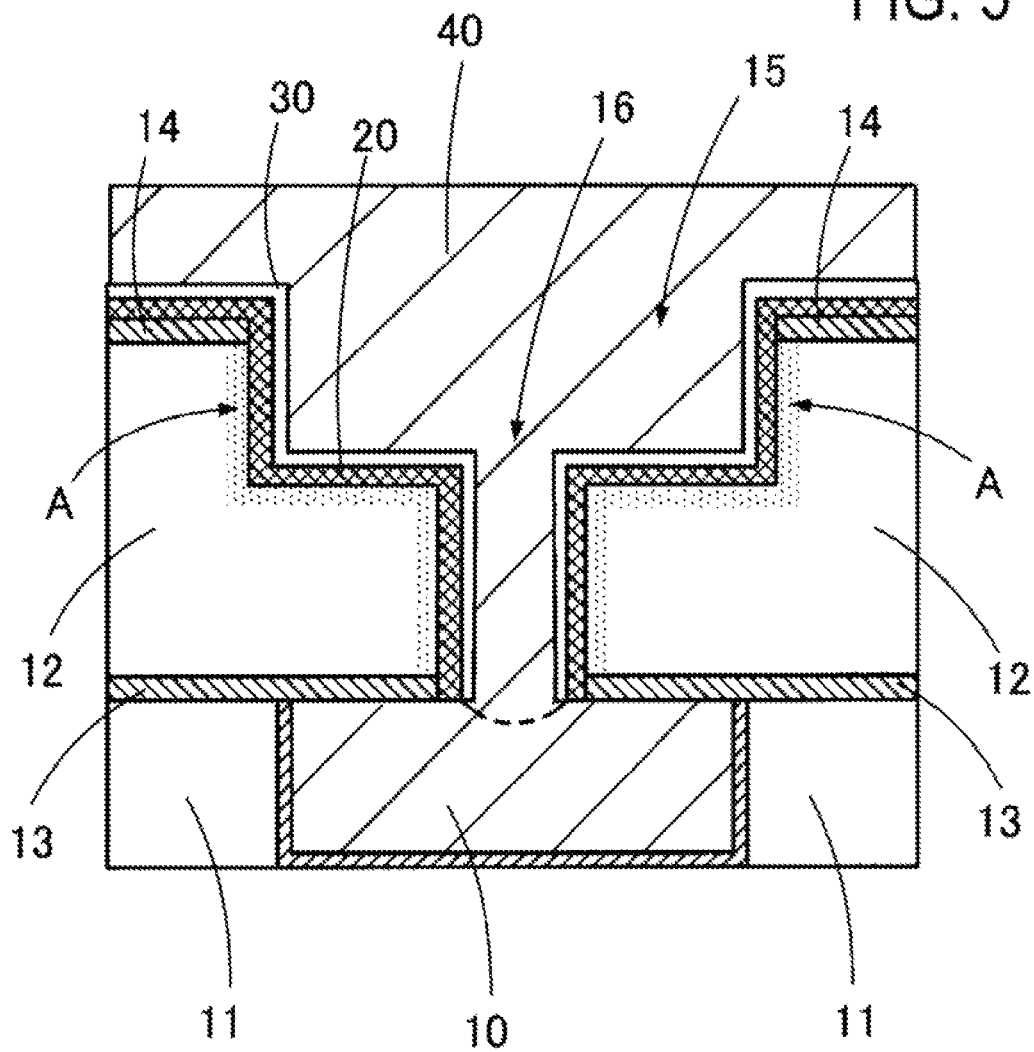
FIG. 5 is a schematic view of a process for manufacturing a semiconductor apparatus according to an embodiment.

Next, as shown in FIG. 5, a copper plating layer 40 is buried by copper sulfate (CuSO₄) plating to form metal wire in the trench 15 and the via hole 16. Thus, the underlying wire 10 and the copper plating layer 40 are electrically connected to each other. The film thickness of the copper plating layer 40 is 500 to 2000 nm, for example. In the case of copper sulfate plating, the current density is 7 to 30 A/cm², for example.

Next, an annealing process is performed on the substrate in either a vacuum or inert gas atmosphere wherein the temperature of the substrate is 150 to 400° C., for example. The heating time is from 30 to 1800 sec, for example. Note, performing the annealing process in air atmosphere or in an atmosphere with minimal oxygen is also acceptable.

Figure 6:
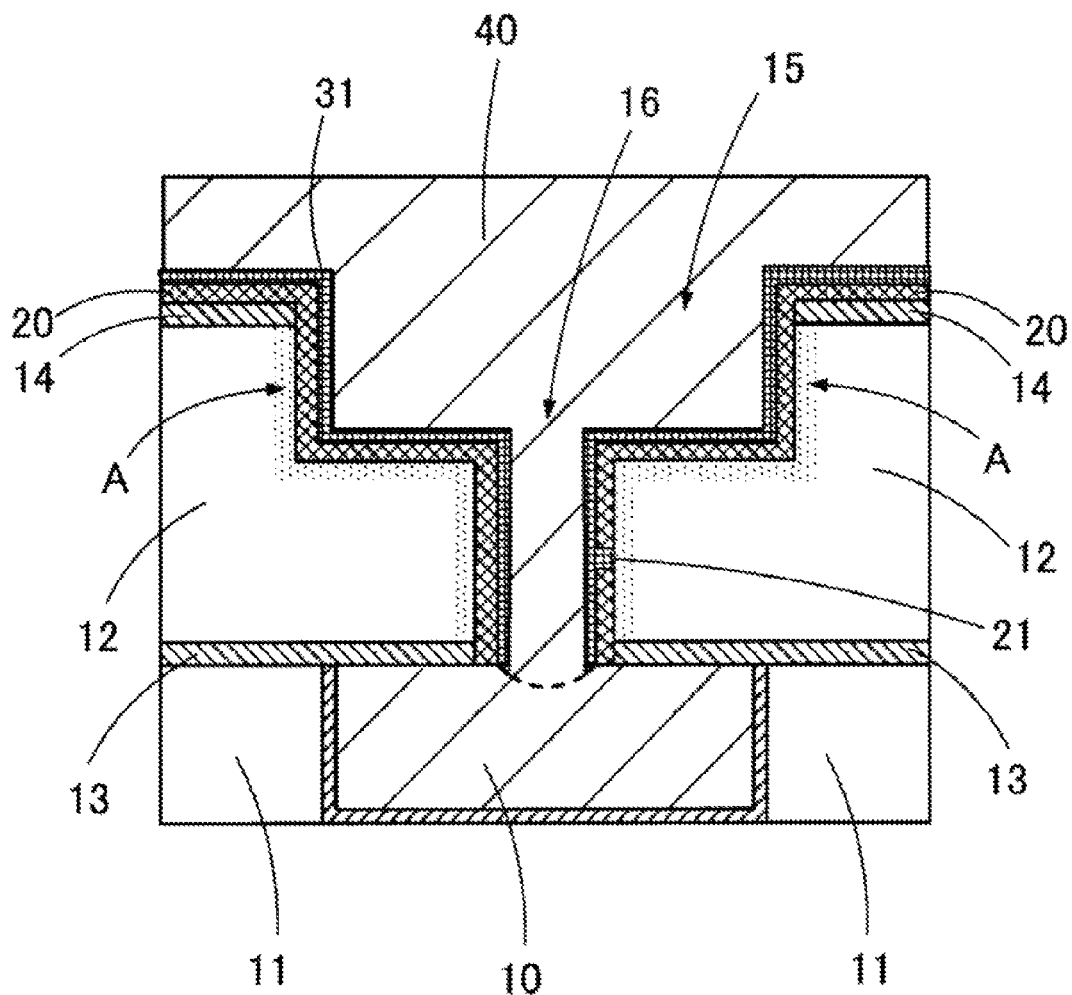
FIG. 6 is a schematic view of a process for manufacturing a semiconductor apparatus according to an embodiment.

Incidentally, the diffusion barrier film 20 is oxidized or altered by moisture contained in the interlayer insulation film 12 during the manufacturing process. However, during the aforementioned annealing process, the oxygen, which exists in the diffusion barrier film 20, reacts with the manganese contained in the copper-manganese seed layer 30 shown in FIG. 4, forming a manganese oxide ($MnO_x$) reaction layer 31 as a barrier layer in a self-aligned manner at the boundary between the diffusion barrier film 20 and the copper plating layer 40 as shown in FIG. 6. Either the manganese oxide reaction layer 31 compensates the barrier capabilities of the diffusion barrier film 20, or the manganese oxide reaction layer 31 itself exerts barrier capabilities. Thus, the barrier capabilities of the copper plating layer 40 in relation to the interlayer insulation film 12 are improved. Also, since a reaction layer is formed at the boundary between the copper plating layer 40 and the diffusion barrier film 20, the adhesion between the copper plating layer 40 and the diffusion barrier film 20 are also improved. Thus, the aforementioned siphon phenomenon and peeling during the CMP can be suppressed.

Furthermore, even if a local defect 21 occurred in the diffusion barrier film 20 and the diffusion barrier film 20 is chipped away at the defect 21 location, silicon and oxygen in the interlayer insulation film 12 react with the manganese in the copper-manganese seed layer 30, in the corresponding defect, forming a $MnSi_xO_y$ reaction layer. At the corresponding chipped away location, the $MnSi_xO_y$ reaction layer exerts barrier capabilities, thereby ensuring the barrier capabilities of the copper plating layer 40 in relation to the interlayer insulation film 12 at the chipped away location.

Figure 7:
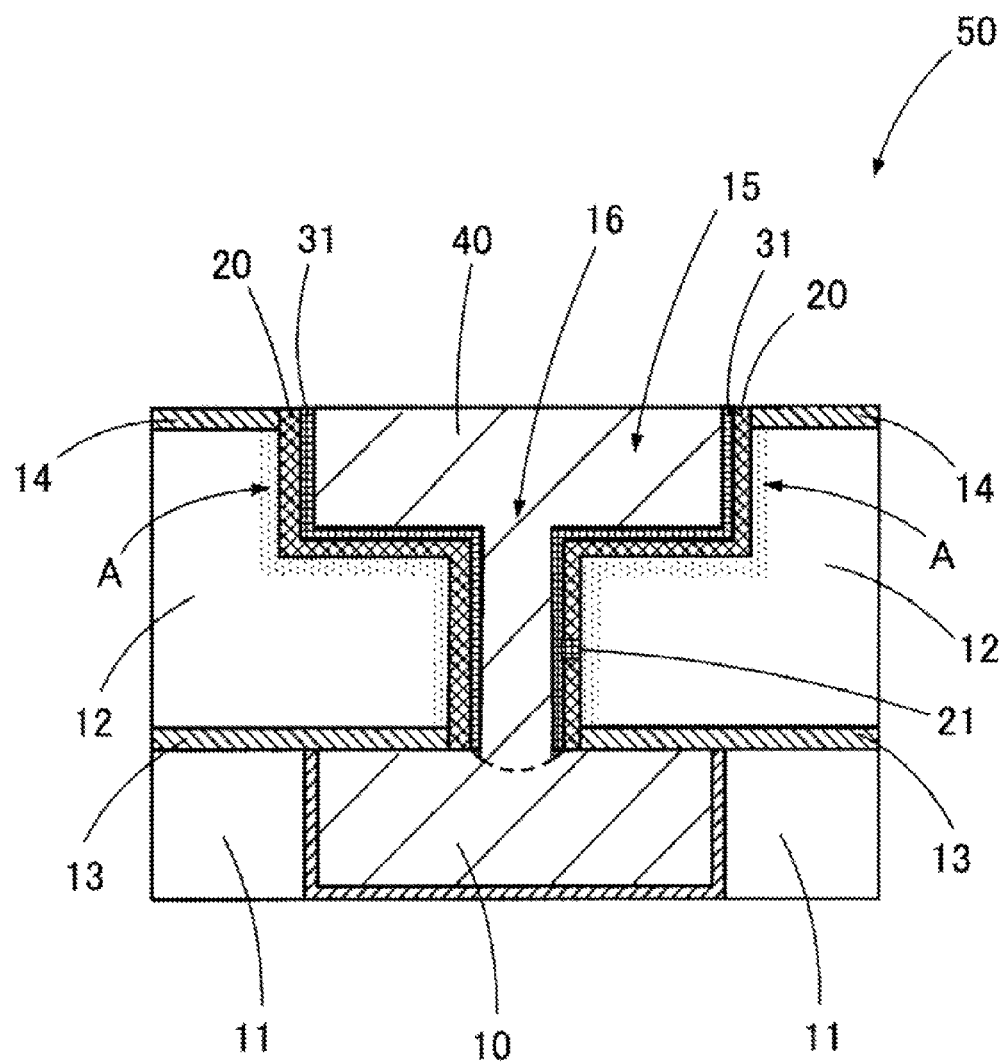
FIG. 7 is a schematic view of a process for manufacturing a semiconductor apparatus according to an embodiment.

Next, as shown in FIG. 7, CMP is performed on the copper plating layer 40 up to the hard mask layer 14 using an organic acid slurry solution. Through the above process, the underlying wire 10, via hole 16 and trench 15 are patterned, and a semiconductor apparatus 50 is completed wherein the interlayer insulation film 12 is formed on the underlying wire 10, the diffusion barrier film 20 is formed on the inner wall of the via hole 16 and the inner wall of the trench 15, the copper plating layer 40 is formed in the via hole 16 and in the trench 15, directly connecting to the underlying wire 10, and the manganese oxide reaction layer 31 as a barrier layer is formed in a self-aligned manner at the boundary between the diffusion barrier film 20 and the copper plating layer 40.

According to the first embodiment, a semiconductor apparatus having the diffusion barrier film 20 and the manganese oxide reaction layer 31 with favorable adhesion and strong barrier capabilities, can be manufactured, thereby improving productivity of semiconductor apparatuses.

First Modified Embodiment

A first modified embodiment is described below. In the first modified embodiment, the manufacturing process up to the formation of the copper plating layer 40 is similar to the described content using FIG. 2 through FIG. 5, so the manufacturing process from the formation of the barrier layer will be described.

Figure 8:
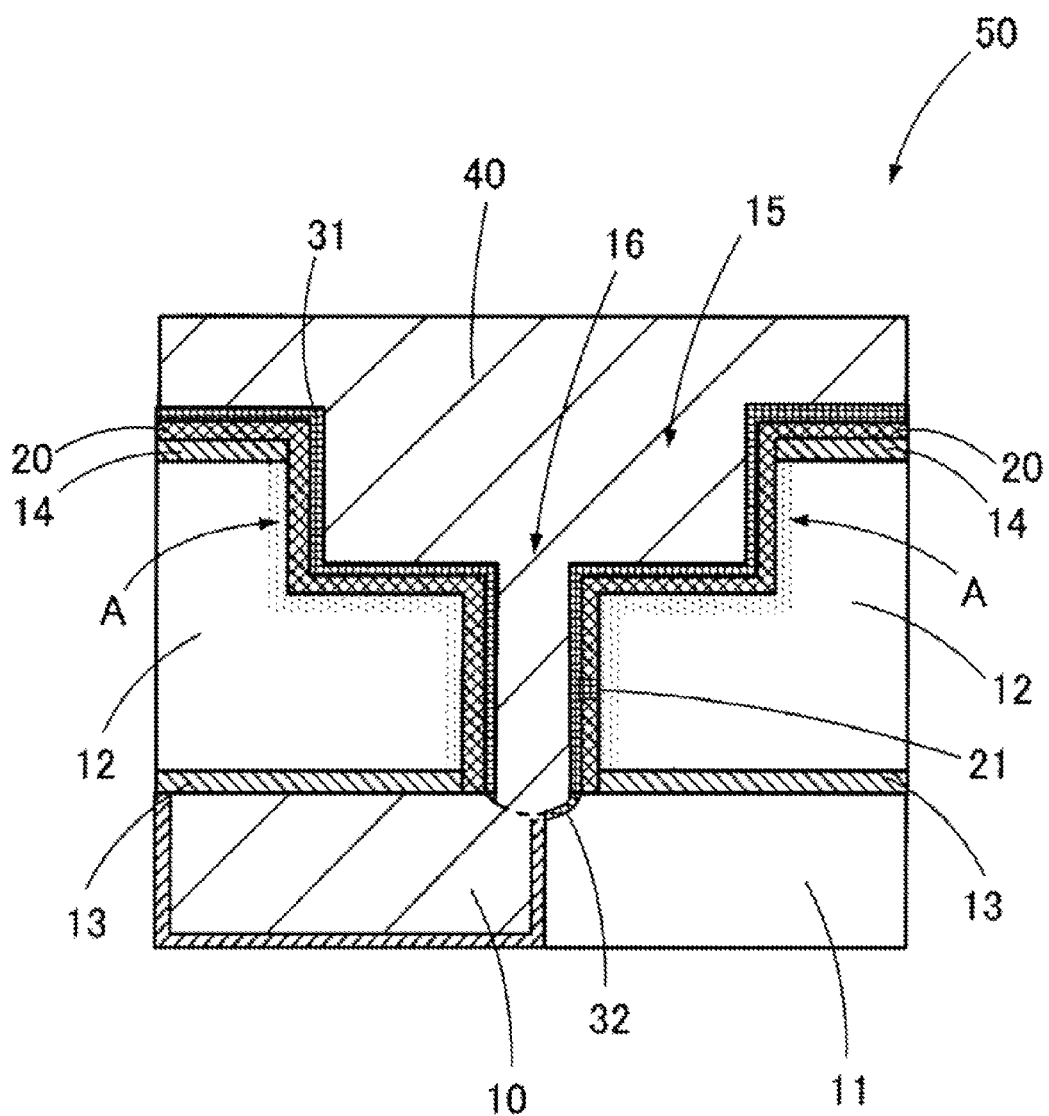
FIG. 8 is a schematic view of a process for manufacturing a semiconductor apparatus in an alternative example of an embodiment.

As shown in FIG. 8, in the first modified embodiment, part of the bottom of the via hole 16 is displaced from the upper surface of the underlying wire 10. Even if part of the bottom of the via hole 16 is displaced from the upper surface of the underlying wire 10 in this manner, the diffusion barrier film 20 formed on the bottom of the via hole 16 can be clearly removed by performing the aforementioned second stage process. Thus, in the second stage, the copper-manganese seed layer 30, shown in FIG. 4, is formed on the underlying wire 10, on the interlayer insulation film 11, and on the diffusion barrier film 20, while concurrently the diffusion barrier film 20 deposited on the bottom of the via hole 16, part of the surface of the underlying wire 10, and part of the surface of the interlayer insulation film 11 formed on the side of the underlying wire 10 are being etched.

Then, by altering the copper-manganese seed layer 30 through an annealing process, a manganese oxide reaction layer 31 is formed on the boundary between the diffusion barrier film 20 and the copper plating layer 40 as a barrier layer.

Additionally, at the boundary between the copper plating layer 40 and the interlayer insulation film 11, the silicon and oxygen in the interlayer insulation film 11 react with the manganese in the copper-manganese seed layer 30, whereby the $MnSi_XO_Y$ reaction layer 32 is formed as a barrier layer at a position lower than the upper face of the underlying wire 10. Thus, the $MnSi_XO_Y$ reaction layer 32 becomes the barrier layer in this location. As a result, even if part of the bottom of the via hole 16 is placed in a location which is displaced in relation to the upper face of the underlying wire 10, the barrier capabilities of the copper plating layer 40 at the corresponding part in relation to the interlayer insulation film 11 are ensured.

Note, from this point forward, the content of the CMP process is similar to that described using FIG. 7, so it will not be described here.

In the first modified embodiment, the annealing process is performed after the copper plating layer 40 is buried in the via hole 16 and the trench 15, then a barrier layer, wherein a component of the copper-manganese seed layer 30 is used as a raw material, is formed at the surface boundary between the diffusion barrier film 20 and the copper plating layer 40 or the surface boundary between the copper plating layer 40 and the interlayer insulation film 11.

Second Embodiment

Next, a second embodiment of the present invention will be described in detail. In the description of the second embodiment, a component which is the same as the component described in an aforementioned embodiment is marked with the same reference and the description thereof will be omitted.

In the second embodiment, the substrate (see FIG. 2) used in the aforementioned embodiment is used. Then, a seed layer is directly formed on the interlayer insulation film without the diffusion barrier film being formed. Therefore, the processes performed after the formation of the seed layer are described.

Figure 9:
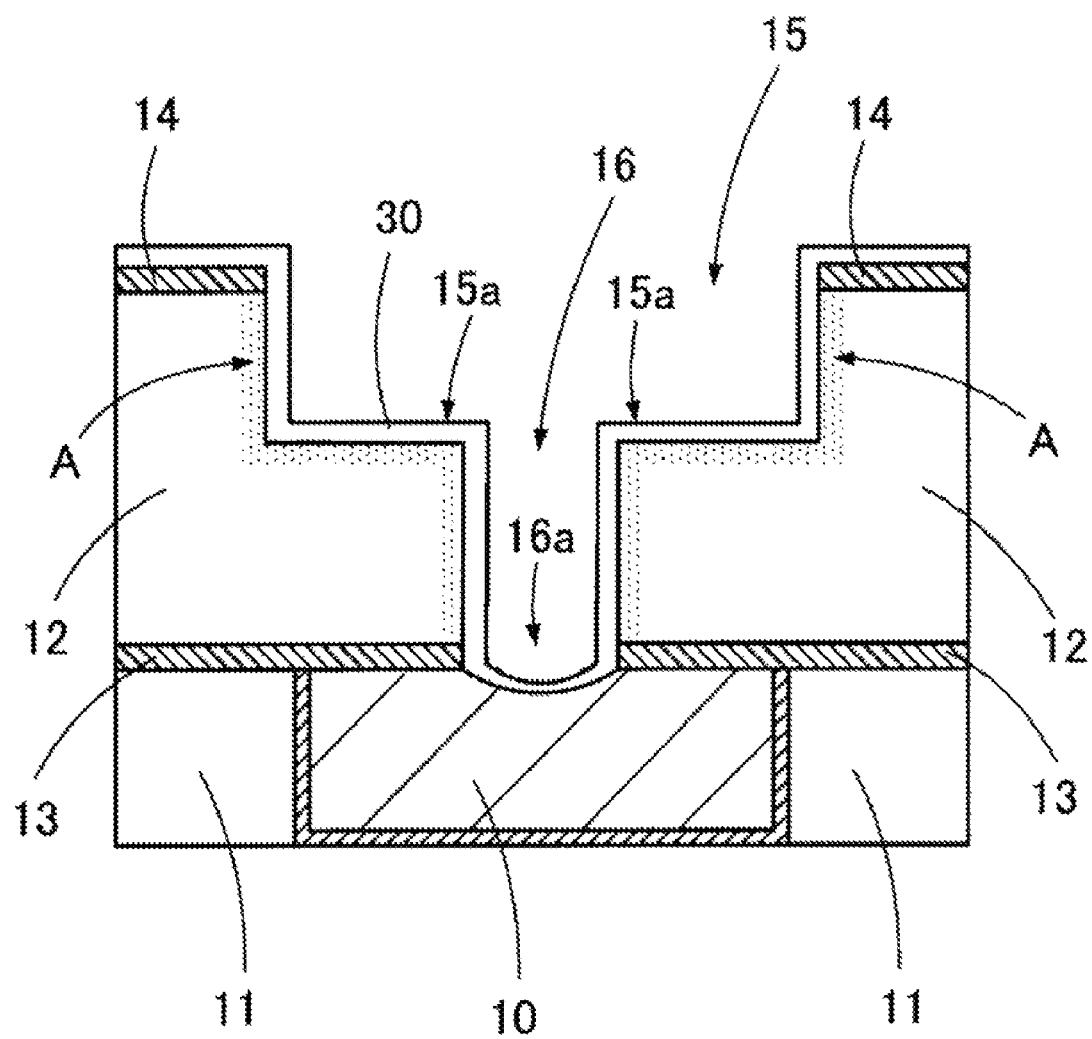
FIG. 9 is a schematic view of a process for manufacturing a semiconductor apparatus in another embodiment.

FIG. 9 through FIG. 13 are schematic views of the process for manufacturing a semiconductor apparatus according to a different embodiment. As shown in FIG. 9, the copper-manganese seed layer 30 is formed on the interlayer insulation film 12 by the sputtering method. Even in the second embodiment, the copper-manganese seed layer 30 is formed by dividing sputtering into a first stage and a second stage. A copper target containing a manganese ratio of 0.5 to 10 atom % is used.

In the first stage, argon is used as the discharge gas for example, the target injection power is from 160 to 960 $mW/m^2$, the atmospheric pressure is from $10^{-5}$ to 10 Pa, whereby a copper-manganese seed layer 30 is formed as the first seed layer on the surface of the inner wall of the via hole 16, the inner wall of the trench 15, and the surface of the underlying wire 10 exposed from the via hole 16. The film thickness of the copper-manganese seed layer 30 formed in the first stage is from 10 to 30 nm for example. Note, when the copper-manganese seed layer 30 of the first stage is formed, applying a bias of from 6 to 16 $mW/m^2$ for example to the substrate is also acceptable.

Then, in the second stage, the copper-manganese seed layer 30 is formed on the first seed layer as the second seed layer. However, with a bias of from 6 to 10 $mW/m^2$ for example continuing to be applied to the substrate, an atmospheric pressure of from $10^{-5}$ to 10 Pa and a target injection power of from 16 to 160 $mW/m^2$ are applied. Thus, the incidence frequency of the incident copper-manganese in the trench 15 and in the via hole 16 is reduced relative to the first stage. In the second stage, the etching effect (resputtering effect) from argon ions or metallic ions emitted from the target is increased and then sputtering is executed. Especially in the second stage, sputtering is executed while regulating the ratio (Vd/Ve) of the deposition rate (Vd) of the manganese seed layer to the etching rate (Ve) on the upper face of the interlayer insulation film 12 so the Vd/Ve ratio is greater than 0.9 but less than 2.0.

Note, the content percentage of manganese in the copper target is not limited to the aforementioned values. For example, a copper target including more than 10 atom % of manganese is also acceptable. Or, a binary sputter method can be used wherein a manganese target and a copper target are used. In this case, the ratio of manganese to copper contained in the seed film can be made to vary by establishing a difference in the target injection power.

According to the second embodiment, in the second stage, the copper-manganese seed layer 30 formed on the bottom 16a of the via hole 16 is deposited in the bottom 16a of the via hole 16 while being etched by argon ions or metallic ions emitted from the target. Additionally, the residue or oxides remaining on the surface of the underlying wire 10 resulting from the patterning of the via hole 16 and the trench 15 are clearly removed by said etching. Then, the copper-manganese deposited on the bottom 16a of the via hole 16 is deposited on the inner wall of the via hole 16 and the inner wall of the trench 15 by the resputtering effect. Thus, in the second embodiment, the copper-manganese seed layer 30 is deposited on the underlying wire 10 and the inner wall of the interlayer insulation film 12 while the copper-manganese seed layer 30 is deposited on the bottom 16a of the via hole 16 and part of the surface of the underlying wire 10 is being etched. Therefore, compared to conventional manufacturing methods, which do not adopt the resputtering process, the coverage of the copper-manganese seed layer 30 in the inner wall of the via hole 16 and the inner wall of the trench 15 is improved in the manufacturing process according to the second embodiment, which adopts the resputtering process. The thickness of the copper-manganese seed layer 30 in the inner wall of the via hole 16 and the inner wall of the trench 15 is thereby increased. As a result, the thickness of the MnSi$_X$O$_Y$ reaction layer of the barrier layer mentioned hereinafter is increased, the barrier capabilities of the MnSi$_X$O$_Y$ reaction layer are therefore improved and the bonding between the MnSi$_X$O$_Y$ reaction layer and the interlayer insulation film 12 is dramatically improved.

Figure 10:
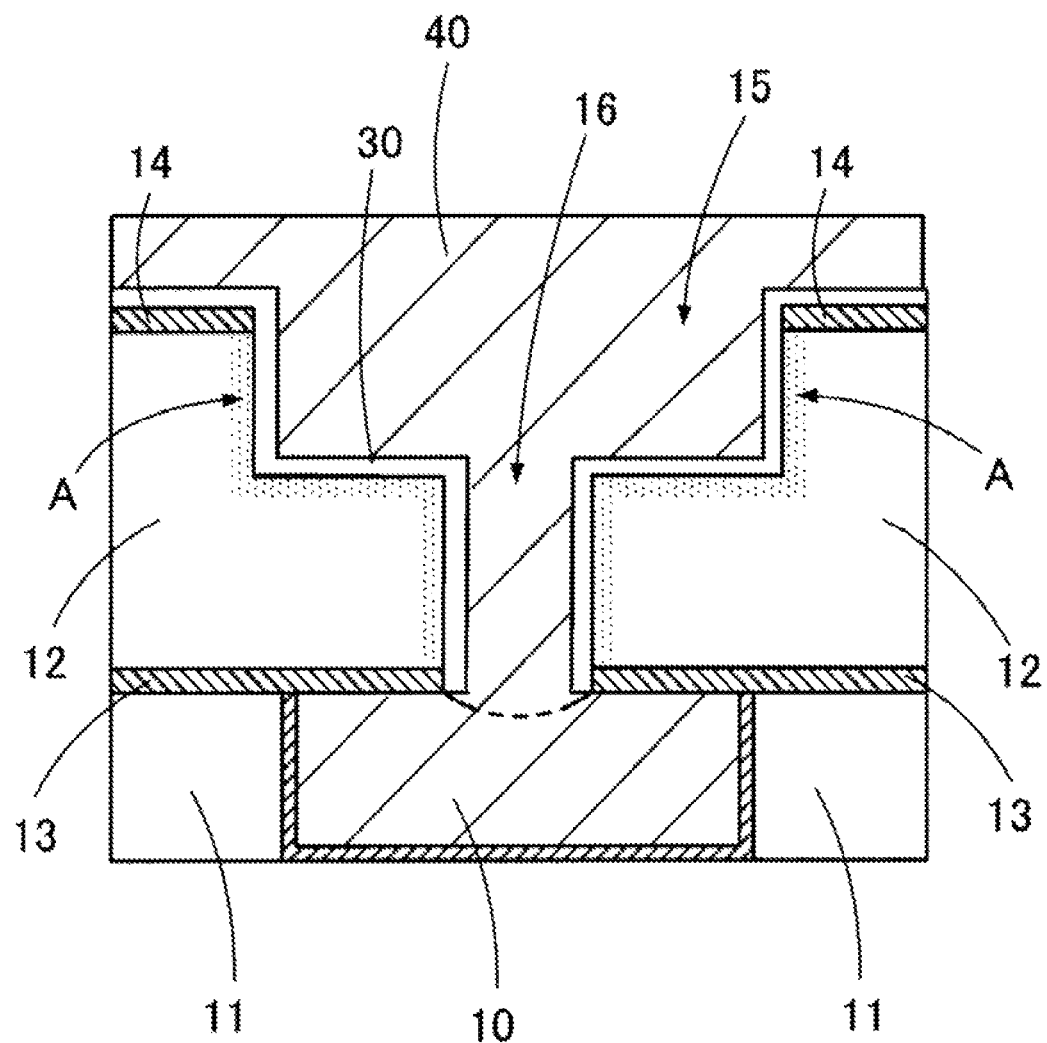
FIG. 10 is a schematic view of a process for manufacturing a semiconductor apparatus in another embodiment.

Next, as shown in FIG. 10, the copper plating layer 40, which is to become the metal wire, is formed in the trench 15 and in the via hole 16 by copper sulfate plating. The underlying wire 10 and the copper plating layer 40 are thereby electrically connected. The film thickness of the copper plating layer 40 is 500 to 2000 nm, for example. In copper sulfate plating, the current density is from 7 to 30 A/cm$^2$, for example.

Next, an annealing process is performed on the substrate in either a vacuum or inert gas atmosphere wherein the temperature of the substrate is 150 to 400° C., for example. The heating time is from 30 to 1800 sec., for example. Note, performing the annealing process in air atmosphere or in an atmosphere with minimal oxygen is also acceptable.

Figure 11:
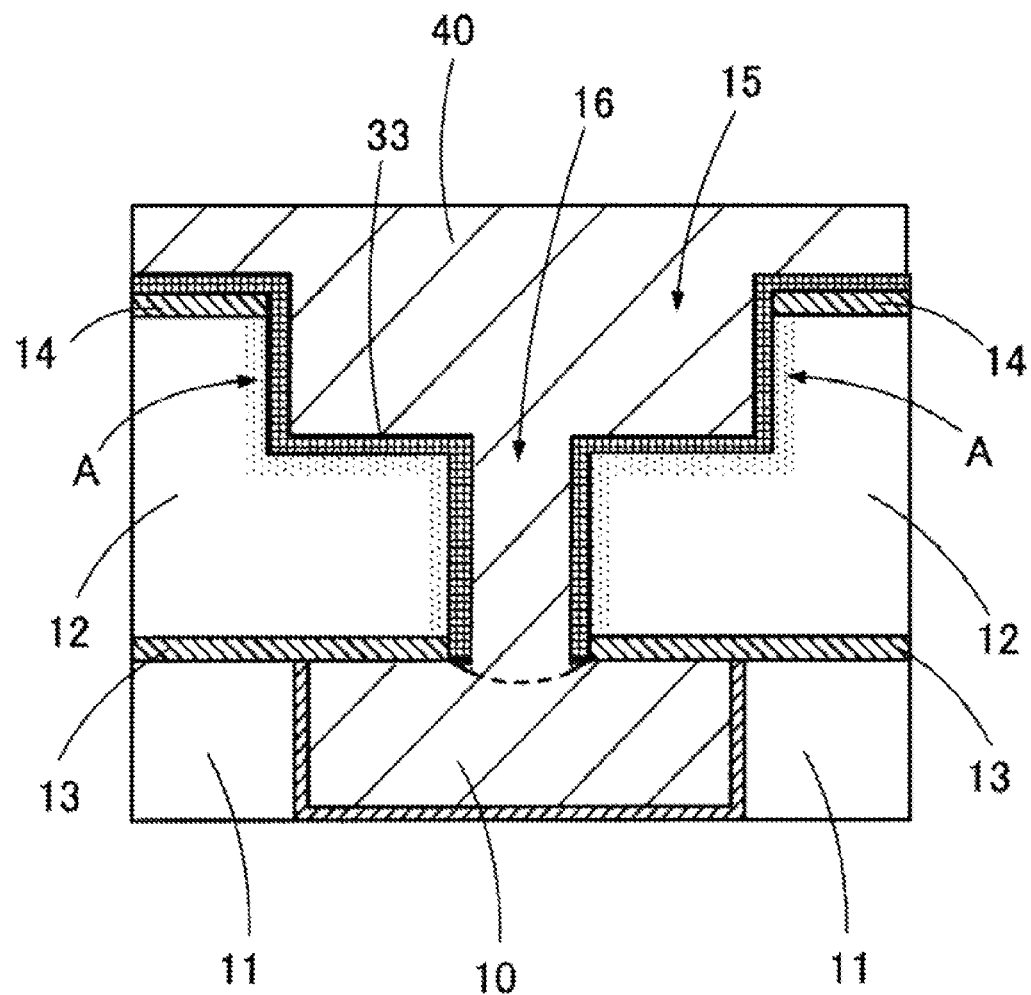
FIG. 11 is a schematic view of a process for manufacturing a semiconductor apparatus in another embodiment.

By performing the aforementioned annealing process, the silicon and oxygen components in the interlayer insulation layer 12 react with the manganese in the copper-manganese seed layer 30 shown in FIG. 9. Consequently, the MnSi$_X$O$_Y$ reaction layer 33 is formed as a barrier layer in a self-aligned manner on the surface boundary between the interlayer insulation film 12 and the copper plating layer 40 as shown in FIG. 11. Due to the fact that the coverage of the copper-manganese seed layer 30 in the inner wall of the via hole 16 and in the inner wall of the trench 15 is improved by the second stage process, the thickness of the MnSi$_X$O$_Y$ reaction layer 33 in the inner wall of the via hole 16 and in the inner wall of the trench 15 is significantly increased. As a result, the barrier capabilities of the copper plating layer 40 in respect to the interlayer insulation film 12 are improved. Also, because a thick reaction layer is formed at the surface boundary between the copper plating layer 40 and the interlayer insulation film 12, the adhesion between the copper plating layer 40 and the interlayer insulation film 12 is also improved. Therefore, the aforementioned siphon phenomenon and peeling during CMP process can be suppressed.

Figure 12:
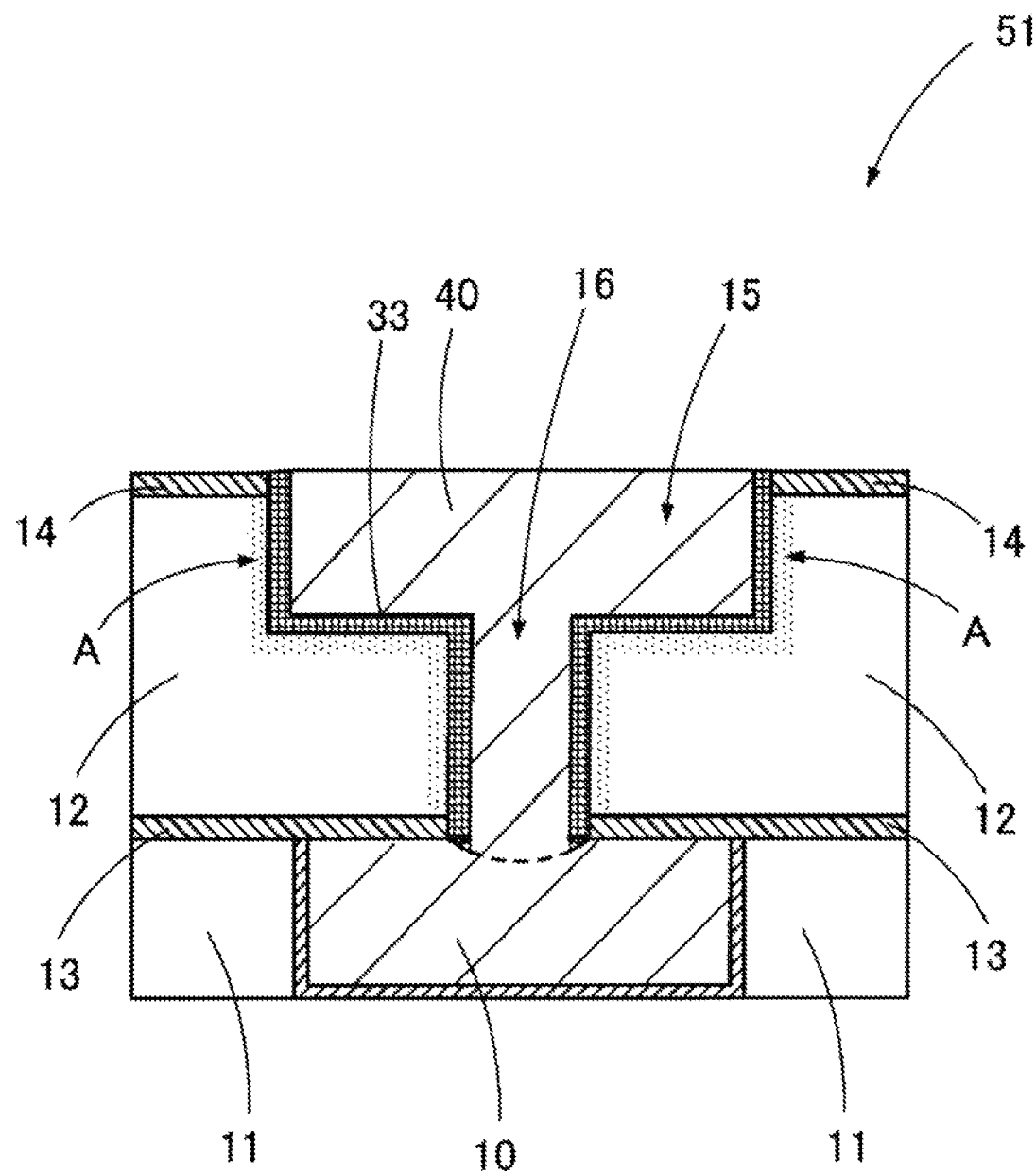
FIG. 12 is a schematic view of a process for manufacturing a semiconductor apparatus in another embodiment.

Next, as shown in FIG. 12, the copper plating layer 40 is CMP treated up to the hard mask layer 14 using an organic acid slurry solution. Through the above process, the underlying wire 10, via hole 16, and trench 15 are patterned, and a semiconductor apparatus 51 is completed wherein the interlayer insulation film 12 is formed on the underlying wire 10, the MnSi$_X$O$_Y$ reaction layer 33 is formed on the inner wall of the via hole 16 and on the inner wall of the trench 15 as a barrier layer, and the copper plating layer 40 is laid out in the via hole 16 and the trench 15, which are directly connected to the underlying wire 10.

Second Modified Embodiment

A second modified embodiment is described next. In the second modified embodiment, the manufacturing process up to the formation of the copper plating layer 40 is similar to the content described using FIG. 9 and FIG. 10, so the manufacturing process starting from the formation of the barrier layer will be described here.

Figure 13:
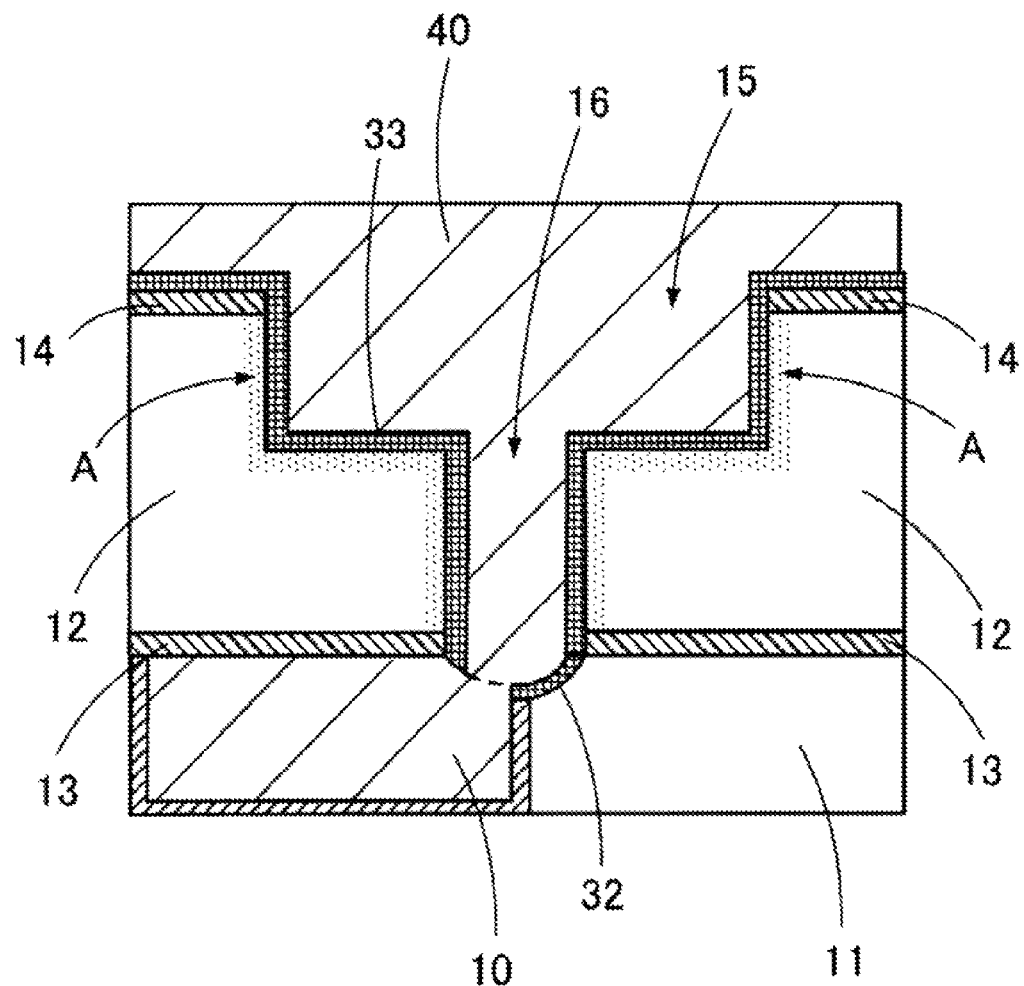
FIG. 13 is a schematic view of a process for manufacturing a semiconductor apparatus in an alternative example of another embodiment.

As shown in FIG. 13, in the second modified embodiment, part of the bottom of the via hole 16 is displaced from the upper surface of the underlying wire 10. Thus, even if part of the bottom of the via hole 16 is displaced from the upper surface of the underlying wire 10, the copper-manganese seed layer 30 shown in FIG. 9 is formed while concurrently part of the surface of the underlying wire 10 and part of the surface of the interlayer insulation film 11 is being etched. Then, by altering the copper-manganese seed layer 30 through an annealing process, the MnSi$_X$O$_Y$ reaction layer 33 is formed as a barrier layer on the surface boundary between the copper plating layer 40 and the interlayer insulation film 12.

Additionally, the MnSi$_X$O$_Y$ reaction layer 32 is formed as a barrier on the surface boundary between the interlayer insulation film 11 and the copper plating layer 40, wherein a reaction occurs between the silicon and oxygen in the interlayer insulation film 11 and the manganese in the copper-manganese seed layer 30 shown in FIG. 9. Therefore, the MnSi$_X$O$_Y$ reaction layer 32 has become the barrier layer in the corresponding part. As a result, even if part of the bottom of the via hole 16 is placed in a position where it is displaced from the upper surface of the underlying wire 10, the barrier capabilities of the copper plating layer 40 at the corresponding part in relation to the interlayer insulation film 11 are ensured.

Note, from this point onward, the content of the CMP process is similar to the content described using FIG. 12, so the description thereof has been omitted here.

According to the second modified embodiment, a semiconductor apparatus having strong barrier capabilities as well as the diffusion barrier film and barrier layer with favorable adhesion can be manufactured, thereby improving the productivity of semiconductor apparatuses.

Thus, in the second modified embodiment, an annealing treatment is performed after the copper plating layer 40 is laid out in the via hole 16 and the trench 15, and a barrier layer having components of the copper-manganese seed layer 30 is formed on the surface boundary between the interlayer insulation film 12 and the copper plating layer 40 or on the surface boundary between the copper plating layer 40 and the interlayer insulation film 11.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor apparatus comprising:
    forming a via hole reaching an underlying wire and a wire trench in an interlayer insulation film formed on the underlying wire;
    forming a diffusion barrier film on said underlying wire exposed through said via hole, on an inner wall of said via hole and on an inner wall of said wire trench;
    forming a seed layer on said underlying wire and on said diffusion barrier film formed on the inner wall of said via hole and the inner wall of said wire trench while said diffusion barrier film on said underlying wire and a part of the underlying wire are etched; and
    forming a metal wire in said via hole and in said wire trench.

2. The method of manufacturing a semiconductor apparatus according to claim 1, wherein said diffusion barrier film is a material containing at least one of the following metals: tantalum (Ta), tungsten (W), titanium (Ti), zirconium (Zr), ruthenium (Ru), or a nitride of these metals.

3. The method of manufacturing a semiconductor apparatus according to claim 1, wherein
said interlayer insulation film is a porous low-dielectric constant material being inorganic or organic material.

4. The method of manufacturing a semiconductor apparatus according to claim 1, wherein
said seed layer is formed on said underlying wire, on said interlayer insulation film formed on the side of said underlying wire, and on said diffusion barrier film while concurrently a part of said underlying wire and a part of said interlayer insulation film formed on the side of said underlying wire are being etched along with said diffusion barrier film deposited on the bottom of said via hole.

5. The method of manufacturing a semiconductor apparatus according to claim 1, wherein
said seed layer is an alloy containing copper (Cu) and manganese (Mn), and said metal wire contains copper.

6. The method of manufacturing a semiconductor apparatus according to claim 1, wherein
forming said seed layer is performed by a sputter method, comprising a first sputter process and a second sputter process, and a bias is applied to a substrate including said underlying wire and said interlayer insulation film during said second sputter process.

7. The method of manufacturing a semiconductor apparatus according to claim 1, wherein
a barrier layer having manganese (Mn) being a component of said seed layer is self-formed on a surface boundary between said diffusion barrier film and said metal wire or on a surface boundary between said metal wire and said interlayer insulation film formed on a side of said underlying wire by performing an annealing process after said metal wire is formed.

8. A method of manufacturing a semiconductor apparatus comprising:
forming a via hole reaching an underlying wire and a wire trench in an interlayer insulation film formed on the underlying wire;
forming a first seed layer on said underlying wire exposed through said via hole, on an inner wall of said via hole, and on an inner wall of said wire trench;
forming a second seed layer on said first seed layer formed on said underlying wire exposed through said via hole, on said inner wall of said via hole, and on said inner wall of said wire trench while said first seed layer deposited on said underlying wire exposed through said via hole is being etched; and
forming a metal wire in said via hole and in said wire trench.

9. The method of manufacturing a semiconductor apparatus according to claim 8, wherein
said interlayer insulation film is a porous low-dielectric constant material being inorganic or organic material.

10. The method of manufacturing a semiconductor apparatus according to claim 8, wherein
said second seed layer is formed on said underlying wire and on the inner wall of said interlayer insulation film while concurrently a part of said underlying wire is being etched along with said first seed layer deposited on said underlying wire.

11. The method of manufacturing a semiconductor apparatus according to claim 8, wherein
said second seed layer is formed on said underlying wire and on said interlayer insulation film formed on a side of said underlying wire while concurrently a part of said underlying wire and a part of said interlayer insulation film formed on the side of said underlying wire are being etched along with said first seed layer deposited on said underlying wire.

12. The method of manufacturing a semiconductor apparatus according to claim 8, wherein
said first seed layer or said second seed layer is an alloy containing copper and manganese, and said metal wire contains copper.

13. The method of manufacturing a semiconductor apparatus according to claim 8, wherein
a barrier layer having manganese (Mn) being a component of said first seed layer or said second seed layer is self-formed on a surface boundary between said interlayer insulation film and said metal wire or on a surface boundary between said metal wire and said interlayer insulation film formed on a side of said underlying wire, by performing an annealing process after said metal wire is formed.

* * * * *